INVENTOR.
ANTHONY R. RONZIO
BY
Horace B. Van Valkenburgh
ATTORNEY

INVENTOR.
ANTHONY R. RONZIO
BY
Horace B. Van Valkenburgh
ATTORNEY

United States Patent Office 2,950,947

Patented Aug. 30, 1960

2,950,947

CHASSIS

Anthony R. Ronzio, 663 Lipan St., Denver, Colo.

Filed Aug. 17, 1956, Ser. No. 604,829

4 Claims. (Cl. 312—320)

This invention relates to a chassis which is particularly adapted to be used in mounting electronic or electrical components, a number of which chassis may be placed in a framework or support therefor.

Electronic and electrical components are commonly mounted on a chassis which is removably supported by a framework or structure in which a plurality of chassis elements may be placed. While prior chassis have been relatively satisfactory in use, they are often quite heavy and unduly expensive, and also have produced difficulties in repair, replacement or change of the electronic or electrical components or parts mounted thereon. A conventional framework which supports a number of chassis may be provided with rectangular openings, in which the various chassis are placed with two or more chassis placed side by side in vertical tiers.

Among the objects of the present invention are to provide a novel chassis, particularly for mounting electronic or electrical components or parts; to provide such a chassis which is readily removed from and placed in a supporting structure or framework; to provide such a chassis which permits electronic or electrical components or parts to be removed readily therefrom, for repair or replacement of parts or changes in the circuit; to provide such a chassis which requires a minimum number of parts and connections therebetween; to provide such a chassis which includes a novel handle structure; to provide such as chassis which is light in weight, yet will support the electronic or electrical components or parts in a stable and firm manner; to provide such a chassis, a number of which are readily stacked when assembled, as for storage; and to provide such a chassis which is economical to manufacture and particularly is easy to assemble.

The foregoing and additional objects of this invention, together with the novel features thereof, will become apparent from the description which follows, taken in connection with the accompanying drawings, in which.

Figure 1:
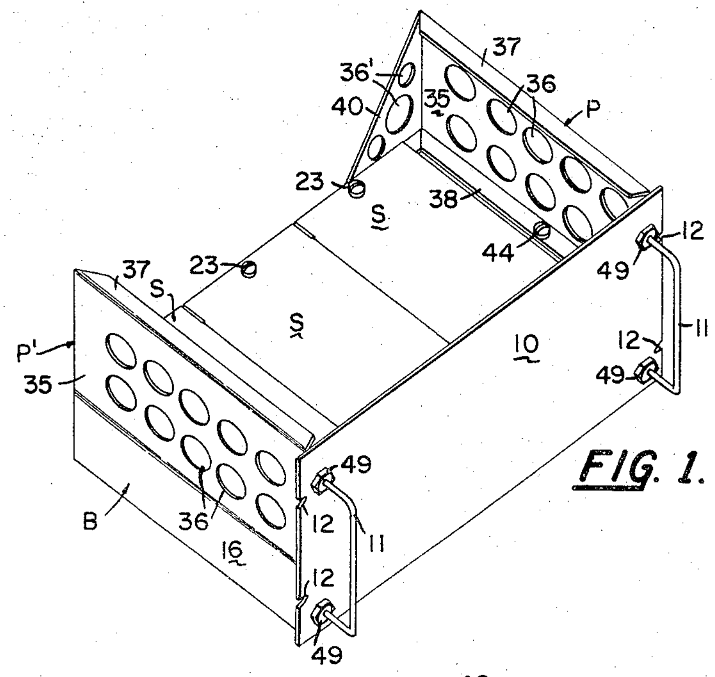
Fig. 1 is a perspective view of a chassis constructed in accordance with this invention, a number of which may be supported by a conventional framework.
Figure 2:
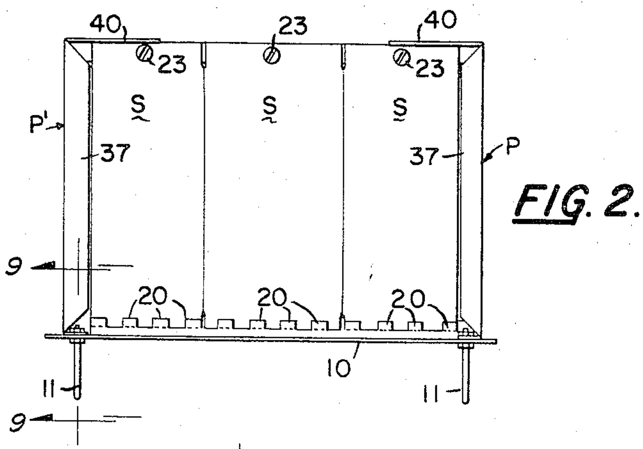
Fig. 2 is a top plan view of the chassis of Fig. 1.
Figure 3:
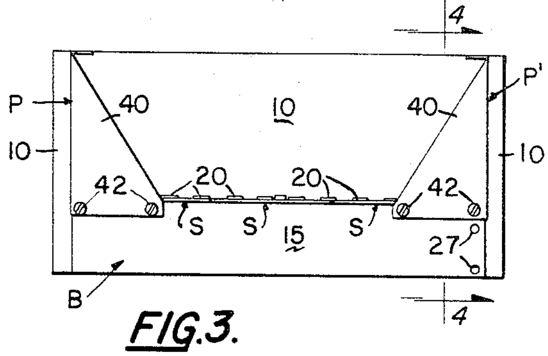
Fig. 3 is a rear elevation of the chassis of Fig. 1.
Figure 4:
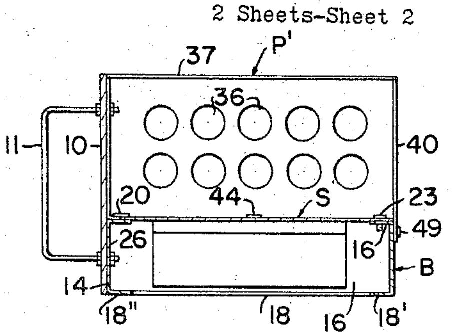
Fig. 4 is a cross section, taken along line 4—4 of Fig. 3.

A chassis for electronic or electrical components and parts, constructed in accordance with this invention, may, as in Figs. 1–3, include a base B to each side of which is attached a respective side panel P and P′, a front panel 10 attached to the base and the side panels by handles 11, and a series of strips S, on which may be mounted the electronic or electrical components or parts and which are readily removable from the remainder of the chassis but are firmly and securely supported in position. The front panel 10, which may extend to each side of side panels P and P′, may be a rectangular plate having holes for handles 11 and also one or more slots 12, such as two, at each side, by which the chassis may be attached to the supporting framework. The supporting framework may be formed of angles or other structural members to provide rectangular openings into each of which a chassis of this invention may be inserted, with base B resting on an angle flange or the like at each side. Base B, as shown also in Figs. 4–6, may be formed from strip to a rectangle, such as to provide a front wall 14, a rear wall 15 and side walls 16. Each side wall 16 may be provided with an upper, inwardly extending flange 17 and a corresponding lower, inwardly extending flange 18, while rear wall 15 may be provided with a similar inwardly extending upper flange 17′ and lower flange 18′ and front wall 14 with a similar inwardly extending, lower flange 18″. Front wall 14 may be provided with an inwardly extending, upper flange 19 which is preferably provided with a series of slits, preferably spaced apart equidistantly, so that a series of ears 20 may be bent upwardly, leaving the alternate ears 21 extending in the plane of the flanges 17 and 17′ for a purpose to be described later. Upper rear flange 17′ may be provided with holes 22 therethrough to accommodate suitable devices for attaching the strips S thereto, such as metal screws 23, as in Figs. 1, 2 and 4, or other fastening devices, while each upper side flange 17 may be provided with a hole 24 and rear wall 15 provided with suitably placed holes, referred to later, for attachment of panel P or P′ thereto, as in a manner described later.

Figure 6:
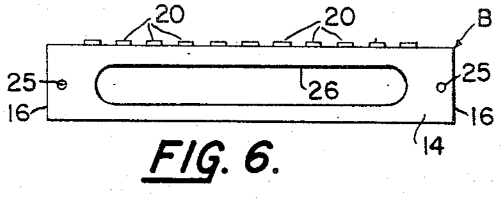
Fig. 6 is a front elevation of the base.

The front wall 14 of base B may be further provided with a pair of holes 25 at each side, for a purpose described later, and also with an elongated slot 26, as in Fig. 6, to permit holes to be drilled through the front plate 10, so that desired parts may be attached to front plate 10 without the necessity for drilling through base B at that position. Such parts, which may be located at any desired points on front plate 10, may include various indicating instruments, such as meters, indicating lights, recorders, registers, scalar units and the like, which should be exposed to view, as well as various parts which should be accessible for regulation, adjustment and the like, such as switches, variable resistors, dials, potentiometers, rheostats, fuses and the like.

Figure 5:
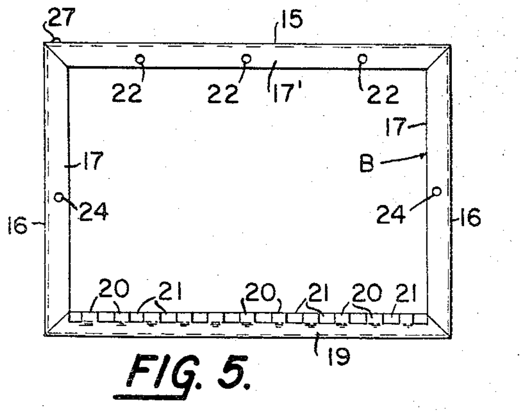
Fig. 5 is a top plan view of a base which forms a part of the chassis of Fig. 1.

As will be evident, the upper flanges and lower flanges of the base each form a rectangular structure for reinforcement purposes, the ends of the flanges being conveniently beveled off so that they will fit together, as shown in Fig. 5, although it is normally unnecessary to attach the flanges together at their meeting edges, but this may be done if desired. Base B thus may be formed from a single strip, preferably of light weight metal, such as aluminum, magnesium alloy, or the like, from which the slots to provide the beveled ends of the various flanges are cut, the various holes punched in flanges 17 and 17′, the slits cut in flange 19, and the flanges then bent over, after which the strip may be formed to rectangular shape and one end lapped over, as at a rear corner, with the lap joint thus formed being secured in a suitable manner, as by spot welding or by rivets 27, shown in Figs. 3 and 5.

Figure 7:
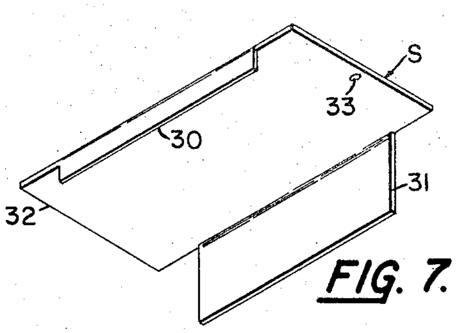
Fig. 7 is a perspective view, looking upwardly and on a slightly enlarged scale, of a strip or support for a plurality of electronic or electrical components or parts.

Each of the strips S, as in Fig. 7, may be formed from a suitable sheet of metal, such as light weight aluminum, magnesium alloy or the like, which may be cut to shape and a shallow depending flange 30 bent downwardly at one side and a deep depending flange 31 bent downwardly at the opposite side, the length of flanges 30 and 31 preferably being less than the length of strip S. As will be evident, when strips S are placed in the chassis, with front edge 32 of each strip S inserted between ears 20 and 21 of base B, a shallow flange 30 will abut against a deep flange 31 of the adjacent strip, which facilitates the insertion and removal of the strips S. The flanges 30 and 31 transform each strip S into a channel structure, thus adding strength and rigidity to each strip, while the abutting flanges of the adjacent strips further adds to the rigidity of the strips in assembled relation. The front edge 32 of each strip S rests on the lower ears 21 of base B and is held securely in position by the wedging action of ears 20, while the rear edge of each strip S may, of course, be attached to rear flange 17' of base B, as by a metal screw 23 of Fig. 1, inserted through a rear hole 33 of strip S, shown in Fig. 7. This connection between strips S and base B is a highly desirable feature of this invention, since strips S are readily placed in the chassis and also removed therefrom, while the single screw attachment, in conjunction with the interfitting ears at the front, provides a secure and rigid connection for the strips. Also, the series of ears 20 and 21 permit strips of different widths to be accommodated in side by side relation. When strips of different widths than for which holes 22 have been drilled are used, it will be necessary to drill additional holes 22. The electronic or eletcrical components or parts are conveniently mounted in each strip S while removed from the chassis, so that necessary holes may be drilled in the strips for attachment of such components and parts, as well as to provide the greatest convenience in making connections and installing wiring therebetween. Such components and parts may include tube sockets, tubes, resistors, transformers, condensers, transistors, power units, speed reducers, timing devices, control transformers, fuses, impedances and other parts of electronic or electrical circuits. It will be noted that the parts mounted on each strip S may comprise a complete assembly and the position of strips S above the bottom of the chassis permits a considerable amount of wiring and the like to be placed underneath the strips, while the preferred length of the deep flanges 31, less than the total length of a strip S, permits wiring connecting components or parts on one strip with those of another strip to be passed around the ends of flanges 31.

Figure 8:
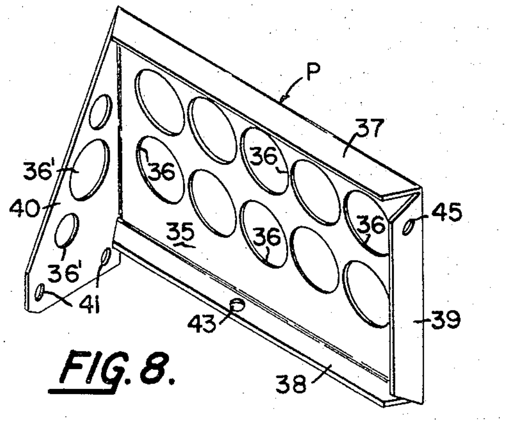
Fig. 8 is a perspective view of a side frame member of the chassis of Fig. 1.

Side panels P and P' are similar but complementary in structure and shape, due to their being mounted at opposite sides of the chassis. Thus, panel P, as in Fig. 8, may include a side wall 35, preferably having a series of holes 36 therein, to provide ventilation and reduce weight and an inwardly extending, upper flange 37, lower flange 38 and front flange 39, while a rear wall 40 preferably also having holes therein, such as holes 36', extends at right angles to the side wall 35, but the lower edge thereof extends below side wall 35 and particularly below lower flange 38. The upper edge of rear wall 40 may slant upwardly or be beveled off, as shown, to provide greater freedom of access to the strip S immediately adjacent thereto, particularly for placing the adjacent strip in the chassis or removing it therefrom.

The flanges 37, 38 and 39, as well as rear wall 40, add rigidity to the structure of the panel, particularly when assembled. Flanges 37 also permit a series of chassis readily to be stacked vertically with base B of each chassis resting on the flanges 37 of the chassis beneath, thus facilitating the storage of assembled chassis. Each panel may be formed of a strip of metal, such as light weight aluminum, magnesium alloy, or the like, which may be cut to shape, before or after the various holes have been punched therein, after which the flanges and end wall may be bent to position. The lower portion of rear wall 40 may be provided with holes 41 therein for attachment to the rear wall 15 of base B, as by metal screws 42 of Fig. 3, inserted through holes 41 and threadedly engaging the holes referred to previously, in the base rear wall 15. Similarly, lower flange 38 of each panel may be provided with a hole 43 for insertion of a metal screw 44 of Figs. 1 and 4 to engage hole 24 of Fig. 5 in base B, thereby to attach the panel to the base. Front flange 39 may be provided with a hole 45, through which one end of a handle 11, for attachment of the panel to the front plate 10, extends.

Figure 9:
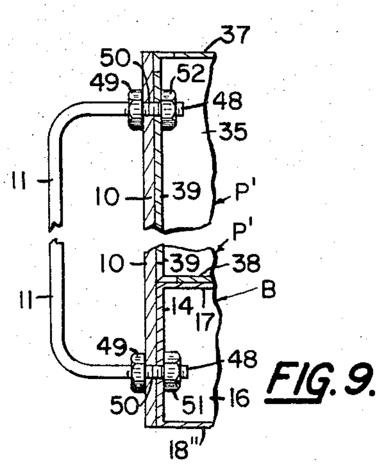
Fig. 9 is a condensed, enlarged fragmentary vertical section, taken along line 9—9 of Fig. 2.

Each handle 11, as in Figs. 1 and 9, may be formed from a section of metal rod, such as brass or other suitable metal, preferably corrosion resistant, the ends of which are provided with threads 48 and which is bent to a generally rectangular or U-shape, as shown. Handles 11 are thus very inexpensive to manufacture, but serve quite adequately, as well as being used in attaching certain parts of the chassis together. Thus, for assembly of the chassis, a nut 49 may be threaded inwardly on each end of each handle 11 and the ends of each handle inserted through holes 50 in front plate 10, shown in Fig. 9, after which base B may be brought into engagement with front plate 10, with the lower end of each handle 11 extending through the hole 25 of Fig. 6, in the front wall of base B at each side, so that an inner nut 51 may be threaded onto the lower extending end of each handle to attach base B to the front plate 10. Then, each side panel P and P' may be placed in position, with the front flange 39 of each abutting against the rear edge of front plate 10 and the hole 45 of Fig. 8 inserted over the upper inner end of each handle 11. Then, an inner nut 52 may be threaded onto the extending upper end of each handle, so as to attach side panels P and P' to front plate 10, as in Fig. 9. To complete the assembly, it is necessary only to place the metal screws 42 of Fig. 3 and the metal screws 44 of Figs. 1 and 4, or other types of attaching devices in corresponding positions. As will be evident, it is necessary only to attach an upper and lower nut to each of the handles 11 and place three metal screws in the holes of each side panel P and P', to assemble a rigid structure. The strips S may be placed in position and attached by metal screws 23 to the base B at the time of manufacture, as for shipping. Of course, when the electronic or electrical components or parts are to be attached to strips S at the same plant, the strips may conveniently be left apart from the chassis until such components and parts are attached thereto. As will also be evident, when the components or parts are attached to a strip S, the strip may be placed in any desired position for such attachment, with both the bottom and top readily accessible. As indicated before, if instruments or the like are to be mounted on front plate 10, suitable holes through the front plates, if necessary, may be readily drilled therethrough at the position of slot 20 of base B, or if such instruments are to be mounted above base B, there is only one thickness, i.e., that of the front plate 10, through which any necessary holes must be drilled. Of course, even after the strips S with the components and parts are mounted in the chassis, the parts and particularly the wiring are readily accessible, particularly from the bottom, so that a major portion of the components or parts may be mounted on strips S before placement of the latter in the chassis, but other components or parts may be mounted on the strip, and particularly wiring connections may be made, after assembly of the strips in the chassis.

From the foregoing, it will be evident that a chassis for electronic or electrical components or parts, constructed in accordance with this invention, fulfills to a marked degree the requirements and objects hereinbefore set forth. Each of the parts, namely the base B, side panels P and P', strips S and front plate 10, are readily made from plate or strip material, while the chassis is readily assembled and a series of chassis are readily stacked in vertical relation, as in the manner described. The degree to which ears 21 are bent upwardly does not prevent front edge 32 of each strip S from being readily placed between the ears, since as long as sufficient space is provided to permit front edge 32 to enter between the ears 20 and 21, the strips may readily be pushed forwardly into the desired position. The various parts are readily made of suitable material, such as sheet or strip aluminum or other light weight metal, while base B, side panels P and P' and strips S may be made of comparatively thin material by virtue of the rigidity produced by the various flanges and the manner of attaching the parts together, as described. Front plate 10 may be made of aluminum or other metal, such as brass, which may be slightly thicker than the sheet or strip of which base B, side panels P and P' and mounting strips S are made, the better to resist impact against the edges of plate 10 during handling, as in placing the chassis in or removing it from the supporting framework, or while repairs, replacements or changes are being made. It will be noted that, while front plate 10 is not shown as provided with reinforcing flanges, it may be so provided, particularly along the upper edge between panels P and P'. As will also be evident, the generally rectangular shape of handles 11 permits the chassis to be easily handled, as well as permitting each chassis to be readily slipped into or out of the supporting framework.

Although a preferred embodiment of this invention has been illustrated and described, it will be understood that other embodiments may exist and various changes made therein, all without departing from the spirit and scope of this invention.

What is claimed is:

1. A chassis for electronic and electrical components and parts, comprising a front plate; a base extending rearwardly from the lower portion of said front plate, said base being generally rectangular and provided with side, front and rear walls and flanges extending inwardly from each of the upper and lower edges of each said wall, said front wall having an elongated aperture and the upper flange of said front wall being provided with spaced slits forming ears therebetween with alternate ears being bent upwardly; a panel at each side above said base and spaced inwardly from the lateral edge of said front plate, each said panel including a side wall provided with apertures and flanges extending inwardly from the top, front and bottom, and a rear wall provided with apertures and extending inwardly from the rear edge of said side wall and to a position below said lower flange, said front flange being attached to said front plate, said lower flange to the corresponding upper flange of said base, and the lower portion of said rear wall to the rear of said base; a handle at each side formed of rod to a U-shape and having threaded ends, each upper end of a handle extending through said front plate and said front flange of said side panel for attachment thereof by nuts and each lower end of each handle extending through said front plate and said front wall of said base for attachment thereof by nuts; and a plurality of strips on which said components and parts may be mounted, each said strip being provided with a downwardly extending flange at each side having a length less than that of said strip and one said flange being deeper than the other said flange, the front edge of each said strip extending between said ears of said front upper flange of said base and the rear edge of each strip being attached by a single screw to the rear upper flange of said base, said strips being disposed in side by side relationship with a depending flange of one strip abutting a flange of the adjacent strip.

2. A chassis for electronic and electrical components and parts, comprising a front plate; a base extending rearwardly from the lower portion of said front plate, said base being generally rectangular and provided with side, front and rear walls and flanges extending inwardly from each of the upper and lower edges of each said wall, said front wall having an elongated aperture and the upper flange of said front wall being provided with spaced slits forming ears therebetween; a panel at each side and above said base; means for attaching said side panels to said base and said front plate and for attaching said base to said front plate; and a plurality of strips on which said components and parts may be mounted and removably attached to said base, alternate ears of the upper flange of said front wall of said base being bent upwardly to form with the remaining ears means for removably attaching the forward edges of said strips to said base.

3. A chassis for electronic and electrical components and parts, comprising a front plate; a base extending rearwardly from the lower portion of said front plate, said base being generally rectangular and having front, side and rear walls, said base having an appreciable depth and an aperture extending downwardly therethrough and inwardly extending flanges around the upper and lower edges of said walls, said upper front base flange being provided with a series of spaced slits which separate alternate upwardly inclined ears; a panel at each side and above said base; means for attaching said side panels to said base and said front plate; means for attaching said base to said front plate; and a plurality of strips on which said components and parts may be mounted, said strips being removably attached to said base and extending across said aperture into engagement with said ears, between said upwardly inclined ears and the remaining ears.

4. A chassis for electronic and electrical components and parts, comprising a front plate; a base extending rearwardly from the lower portion of said front plate, said base having side, front and rear walls of an appreciable depth, a relatively large aperture extending downwardly therethrough and inwardly extending side flanges; a panel at each side of and above said base, each side panel including a side wall provided with apertures and flanges extending inwardly from the top, front and bottom, and a rear wall provided with apertures and extending inwardly from the rear edge of said side wall and to a position below said bottom flange, said front flange being attached to said front plate, said bottom flange to the corresponding side flange of said base, and the lower portion of said rear wall to the rear wall of said base; a plurality of strips on which said components and parts may be mounted, said strips being removably attached to said base and extending across said aperture; and a pair of handles attached to said front plate at laterally spaced positions, each handle being formed of rod and disposed in a generally rectangular U-shape, with one end of each handle attaching a side panel to the said front plate and the opposite end of each handle attaching the front wall of said base to said front plate.

References Cited in the file of this patent

UNITED STATES PATENTS

| | | |
|---|---|---|
| 813,944 | Bubar | Feb. 27, 1906 |
| 2,169,892 | Bevington | Aug. 15, 1939 |
| 2,290,148 | Amidon | July 21, 1942 |
| 2,411,528 | Dodington | Nov. 26, 1946 |
| 2,486,764 | Singer | Nov. 1, 1949 |
| 2,614,157 | Montgomery | Oct. 14, 1952 |
| 2,630,364 | Gleason | Mar. 3, 1953 |
| 2,658,101 | Coxe | Nov. 3, 1953 |
| 2,789,024 | Heisler | Apr. 16, 1957 |

OTHER REFERENCES

"Electronics," Buyers' Guide Issue, June 1954, p. 470.

Allied Radio Corporation Catalog 140, 1955, p. 233, chassis and mounting plates item.